US011536950B2

(12) United States Patent
Payne et al.

(10) Patent No.: US 11,536,950 B2
(45) Date of Patent: Dec. 27, 2022

(54) CAPACITIVE-BASED DETERMINATION OF MICROMIRROR STATUS

(71) Applicant: TEXAS INSTRUMENTS INCORPORATED, Dallas, TX (US)

(72) Inventors: Robert F. Payne, Lucas, TX (US); Molly Nelis Sing, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 147 days.

(21) Appl. No.: 16/226,420

(22) Filed: Dec. 19, 2018

(65) Prior Publication Data

US 2019/0204587 A1 Jul. 4, 2019

Related U.S. Application Data

(60) Provisional application No. 62/612,270, filed on Dec. 29, 2017.

(51) Int. Cl.
| | |
|---|---|
| *G02B 26/00* | (2006.01) |
| *G02B 26/08* | (2006.01) |
| *G01B 7/30* | (2006.01) |
| *H03K 21/38* | (2006.01) |
| *G09G 3/34* | (2006.01) |
| *G11C 11/413* | (2006.01) |
| *G11C 11/41* | (2006.01) |

(52) U.S. Cl.
CPC ............ *G02B 26/0841* (2013.01); *G01B 7/30* (2013.01); *G09G 3/346* (2013.01); *G11C 11/41* (2013.01); *G11C 11/413* (2013.01); *H03K 21/38* (2013.01); *B81B 2201/042* (2013.01); *G09G 2300/0847* (2013.01)

(58) Field of Classification Search
CPC .................. G01B 7/30; G02B 26/0841; B81B 2201/042; G09G 3/346; G09G 2300/0842; G09G 2300/0852; G09G 2300/0847; G11C 11/41; G11C 11/413; H03K 21/38
USPC .................. 359/290, 291, 295; 345/108, 205
See application file for complete search history.

(56) References Cited

U.S. PATENT DOCUMENTS

| 6,191,883 B1 * | 2/2001 | Huffman | G02B 26/0841 |
| | | | 345/84 |
| 6,628,258 B1 * | 9/2003 | Nakamura | G09G 3/3659 |
| | | | 345/206 |

(Continued)

*Primary Examiner* — Mahidere S Sahle
(74) *Attorney, Agent, or Firm* — Michelle F. Murray; Frank D. Cimino

(57) ABSTRACT

A digital micromirror device includes a plurality of micromirror cells on a semiconductor die. Each respective cell includes a memory circuit and an electrode selection circuit. At least some of the micromirror cells include a micromirror and each respective memory circuit controls a micromirror tilt angle. For a given memory circuit controlled to a first tilt angle, a measurement circuit measures a first value indicative of a capacitance between a first electrode and the micromirror and measures a second value indicative of a capacitance on the second electrode. For a second micromirror tilt angle, the measurement circuit measures a third value indicative of a capacitance between the first electrode and the micromirror and measures a fourth value indicative of a capacitance on the second electrode. The measurement circuit generates a signal indicative of whether the micromirror is stuck at a particular angle or missing.

20 Claims, 9 Drawing Sheets

(56) References Cited

U.S. PATENT DOCUMENTS

| | | | | |
|---|---|---|---|---|
| 7,548,365 B2* | 6/2009 | Huffman | ............... | G11C 11/412 |
| | | | | 327/142 |
| 2002/0051096 A1* | 5/2002 | Yamazaki | .......... | G02B 26/0833 |
| | | | | 348/771 |
| 2003/0090478 A1* | 5/2003 | McKnight | ................. | G06T 3/40 |
| | | | | 345/204 |
| 2006/0267889 A1* | 11/2006 | Kimura | ............... | G09G 3/2022 |
| | | | | 345/84 |
| 2007/0064469 A1* | 3/2007 | Umezaki | ................ | G09G 3/325 |
| | | | | 365/154 |
| 2008/0137173 A1* | 6/2008 | Kim | ................... | G02B 26/0841 |
| | | | | 359/291 |
| 2009/0310398 A1* | 12/2009 | Nguyen | ................ | G11C 11/413 |
| | | | | 365/156 |
| 2010/0046062 A1* | 2/2010 | Maeda | ............... | G02B 26/0833 |
| | | | | 359/291 |
| 2012/0044215 A1* | 2/2012 | Chen | ................... | G09G 3/3648 |
| | | | | 345/204 |
| 2015/0217990 A1* | 8/2015 | Carminati | ............. | B81B 3/0043 |
| | | | | 353/98 |
| 2016/0005361 A1* | 1/2016 | Kajiyama | ................ | H04N 9/30 |
| | | | | 345/697 |
| 2018/0358339 A1* | 12/2018 | Iguchi | ................ | H01L 25/0753 |

\* cited by examiner

| ROW | MEASURE | WLD | MEASURELR | WLL | WLR |
|---|---|---|---|---|---|
| 1 | 0 | 0 | 0 | 0 | 0 |
| 2 | 0 | 0 | 1 | 0 | 0 |
| 3 | 0 | 1 | 0 | 1 | 0 |
| 4 | 0 | 1 | 1 | 1 | 0 |
| 5 | 1 | 0 | 0 | 1 | 0 |
| 6 | 1 | 0 | 1 | 0 | 1 |
| 7 | 1 | 1 | 0 | 1 | 0 |
| 8 | 1 | 1 | 1 | 0 | 1 |

CAPACITIVE-BASED DETERMINATION OF MICROMIRROR STATUS

CROSS-REFERENCE TO RELATED APPLICATION

This case claims priority to, and incorporates by reference, U.S. Provisional Application No. 62/612,270, entitled "Capacitive-Based Determination of Micromirror Status," filed Dec. 29, 2017.

BACKGROUND

A digital micromirror device (DMD) includes an array of micromirrors. The micromirrors can be individually controlled to one tilt state or another through electrostatic forces created by voltages on electrodes adjacent each micromirror. A light source illuminating the array of micromirrors can be reflected to an image receiving element such as an optical lens for focusing and creation of an image or to a heat sink. The tilt angle of each micromirror can be individually controlled to reflect to the light to the image receiving element or to the heat sink. It is possible for an individual micromirror to become "stuck" or to be missing altogether and unable to be rotated between different tilt angles as otherwise desired.

SUMMARY

In one aspect of the disclosure, a digital micromirror device (DMD) includes a plurality of micromirror cells on a semiconductor die, with each respective micromirror cell including a memory circuit and an electrode selection circuit. Each of at least some of the micromirror cells includes a micromirror and each respective memory circuit is configured to control a micromirror tilt angle. A measurement circuit is configured to, for a given memory circuit controlled for a first micromirror tilt angle, measure a first value indicative of a capacitance between a first electrode and the micromirror and to measure a second value indicative of a capacitance between a second electrode and the micromirror. For the memory circuit controlled for a second micromirror tilt angle, the measurement circuit is configured to measure a third value indicative of a capacitance between the first electrode and the micromirror and to measure a fourth value indicative of a capacitance between the second electrode and the micromirror. The measurement circuit generates a signal indicative of whether the micromirror is stuck at a particular angle or missing.

In other aspect, a DMD includes a plurality of micromirror cells on a semiconductor die. Each respective micromirror cell includes a micromirror, a memory circuit and an electrode selection circuit. The memory circuit is configured to control a tilt angle of the corresponding micromirror. The memory circuit of each respective micromirror cell includes a first electrode and a second electrode. For each respective micromirror cell, the memory circuit is configured to provide electrical connectivity between a measurement circuit and the first electrode for determination of a first value indicative of a first capacitance between the first electrode and the micromirror. The electrode selection circuit is configured to provide electrical connectivity between the measurement circuit and the second electrode for determination of a second value indicative of a second capacitance between the second electrode and the micromirror.

In yet another aspect of the disclosure, a DMD includes an array of micromirror cells on a semiconductor die, with each respective micromirror cell including a memory circuit, a micromirror, and an electrode selection circuit. Each respective memory circuit is configured to control a tilt angle of its respective micromirror. A measurement circuit on the semiconductor die is coupled to the electrode selection circuit of at least one micromirror cell. The measurement circuit includes a current source, a comparator and a counter. For a given memory circuit controlled for a first micromirror tilt angle, the measurement circuit is configured to measure a first value indicative of a capacitance between a first electrode and the micromirror and to measure a second value indicative of a capacitance between a second electrode and the micromirror. For the memory circuit controlled for a second micromirror tilt angle, the measurement circuit is configured to measure a third value indicative of a capacitance between the first electrode and the micromirror and to measure a fourth value indicative of a capacitance between the second electrode and the micromirror. The measurement circuit is configured to provide current from its current source to the memory circuit and to count pulses of a clock until a voltage from the memory circuit reaches a threshold.

BRIEF DESCRIPTION OF THE DRAWINGS

For a detailed description of various examples, reference will now be made to the accompanying drawings in which.

DETAILED DESCRIPTION

The disclosed examples are directed to a digital micromirror device (DMD) that includes multiple micromirror cells on a semiconductor substrate. Each micromirror cell includes a micromirror that can be titled to a first angle or a second angle by a memory circuit. Each micromirror cell also includes a memory circuit and an electrode selection circuit. The micromirror cells are arranged in an array across the semiconductor substrate in one example. Control signals received by the memory circuit of each micromirror cell causes the memory cell to rotate the micromirror between the first and second tilt angles, or a neutral position.

In some example, the DMD also includes a measurement circuit, although in other examples, the measurement circuit is external but coupled to the DMD. The measurement circuit couples to one or more micromirror cells. The measurement circuit determines a value indicative of a first capacitance between a first electrode of a given micromirror cell and the corresponding micromirror as well as another value indicative of a second capacitance between a second electrode of the given micromirror cell and the corresponding micromirror. If the micromirror is able to tilt between the first and second tilt angles, the values indicative of the first and second capacitances will change between the micromirror being at one tilt angle and the micromirror being at the other tilt angle. If the values indicative of the capacitances do not change as expected, then the micromirror is likely stuck at a particular angle or missing altogether. As such, the measurement circuit generates an output signal indicative of whether the micromirror is stuck or missing. Based on the number of micromirror cells on the DMD, more than one measurement circuit may be provided for the DMD. Each measurement circuit is configured to assess the tilt status of one or more of the micromirror cells of the DMD.

Figure 1A:
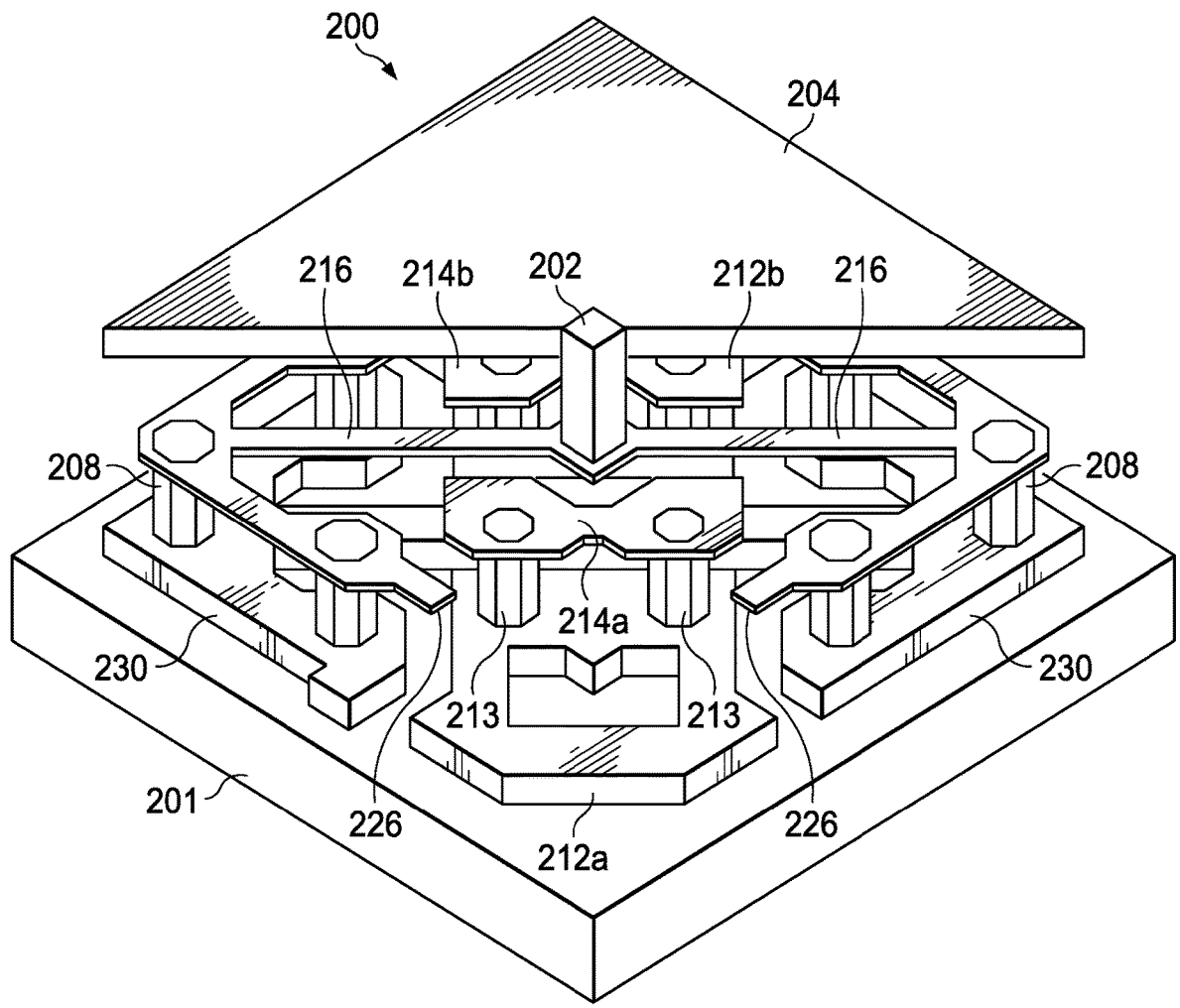
FIG. 1A illustrates an individual micromirror cell of a digital micromirror device (DMD) in accordance with an aspect of the disclosure.

As noted above, the DMD includes an array of micromirrors with each micromirror mechanically and electrically coupled to a corresponding torsion hinge by way of a conductive via. Each micromirror can be made to rotate to one position or another (e.g., +/−12 degrees) or to a neutral position through application of suitable voltages to electrodes. FIG. 1A illustrates a single DMD micromirror cell 200. An array of such micromirror cells may be formed on a common semiconductor die 201. The DMD micromirror cells 200 of FIG. 1A may include a hinge portion, an address portion, and a mirror portion. The hinge portion includes a hinge 216 (which may be a torsion hinge), supported on each side by hinge posts. Six bias vias 208 support spring tips 226 (two of which are shown in FIG. 1A and two more are present but hidden in this view) and hinge 216 above the lower layer 230. The bias vias 208 may also operate to relay a bias voltage to hinge 216. A micromirror 204 is supported above the hinge 216 by a mirror via 202. In addition to providing support for the micromirror 204, the mirror via 202 may conductively transfer the bias voltage to the micromirror 204. The bias voltage may be conductively transferred to the spring tips 226 and hinge 216 through the six bias vias 208. The bias voltage may be further transferred from the hinge 216 to the micromirror 204 through the mirror via 202.

The address portion of the DMD pixel element 200 includes two address pads 212a, 212b (collectively address pads 212) that each connect to raised address electrodes 214a, 214b, respectively. As illustrated in FIG. 1A, address vias 213 support the raised address electrodes 214a, 214b above each address pad 212a, 212b. In addition to supporting the raised address electrodes 214a, 214b, the address vias 213 relay a control or address voltage from the address pads 212a, 212b to the raised address electrodes 214a, 214b. The address pads 212a, 212b are in communication with control circuitry formed on the semiconductor die 201 and shown in other figures, which selectively applies a control or address voltage to one of the two address pads 212a, 212b to create an electrostatic force between the micromirror 204 and the raised address electrodes 214a, 214b. A similar electrostatic force may be created between the micromirror 204 and the address pads 212a, 212b.

The range of motion of the micromirror 204 may be limited by spring tips 226. During operation of DMD micromirror cell 200, spring tips 226 provide a landing point for micromirror 204. For example, when micromirror 204 is tilted in the direction of the raised address electrode 214a and address pad 212a, the spring tips 226 positioned proximate these address elements operate as a landing point for micromirror 204. Conversely, when micromirror 204 is tilted in the direction of the raised address electrode 214b and address pad 212b, the spring tips 226 on the opposite side (and hidden in the view of FIG. 1) positioned proximate these address elements operate as a landing point for micromirror 204. Thus, micromirror 204 may be tilted in the positive or negative direction until the micromirror 204 contacts one or more spring tips 226.

Figure 1B:
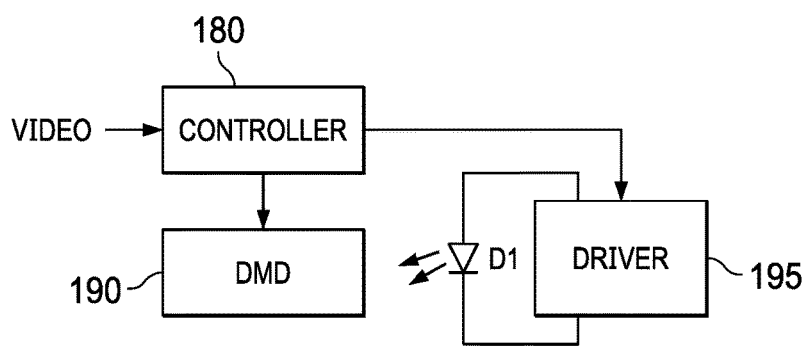
FIG. 1B illustrates the DMD coupled to a controller and a light source in accordance with an aspect of the disclosure.

FIG. 1B shows that a DMD 190 (comprising an array of micromirror cells 200) is controlled by a controller 180. Based on a video signal, the controller 180 asserts one or more control signals to the DMD 190 to cause the DMD 190 to individually rotate each of its micromirrors. The controller 180 also asserts control signals to a driver 195 which is coupled to one or more light emitting diodes (LEDs) D1 to generate light to reflect off of the micromirrors 204. A micromirror 204 tilted to one tilt angle will reflect the light from LED D1 to an imaging surface (e.g., an optical lens). A micromirror 204 tilted to another angle will reflect the light away from the optical lens to, for example, a heat sink. Thus, each micromirror represents a pixel in an image produced by the DMD 190.

Various figures illustrate transistor switches. Some of such switches are shown in a symbolic switch representation and other switches are shown with a transistor symbol. All references to a switch or transistor being open means the transistor is off and not conducting current between its current terminals (e.g., between a source and a drain in the case of a metal oxide semiconductor field effect transistor, or between an emitter and a collector in the case of a bipolar junction transistor). All references to a switch or transistor being closed means the transistor is on and conducting current between its current terminals. As such, a reference to a transistor being "on" is equivalent to the transistor being "closed". A reference to a transistor being "off" is equivalent to the transistor being "open".

Figure 2:
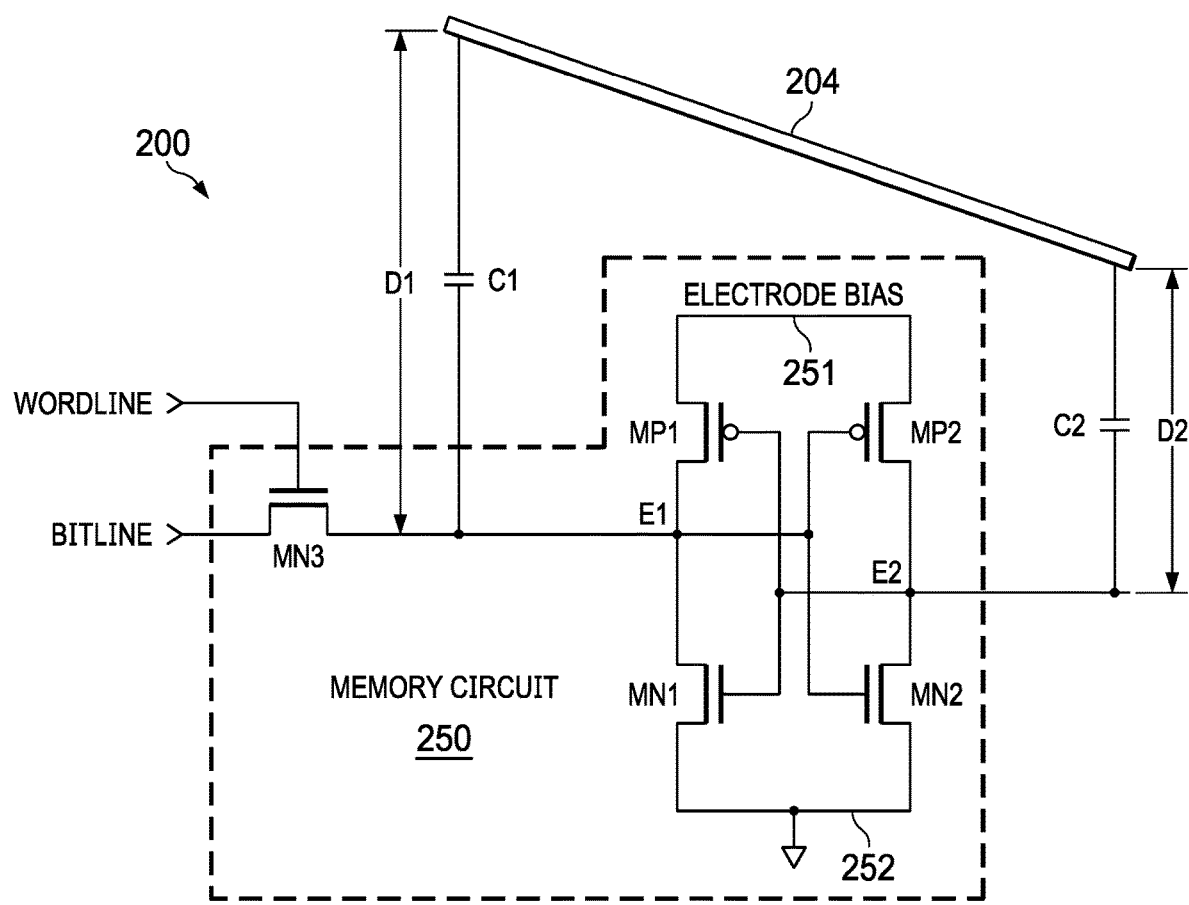
FIG. 2 illustrates a micromirror cell with its micromirror tilted at angle in accordance with an aspect of the disclosure.
Figures 3, 10:
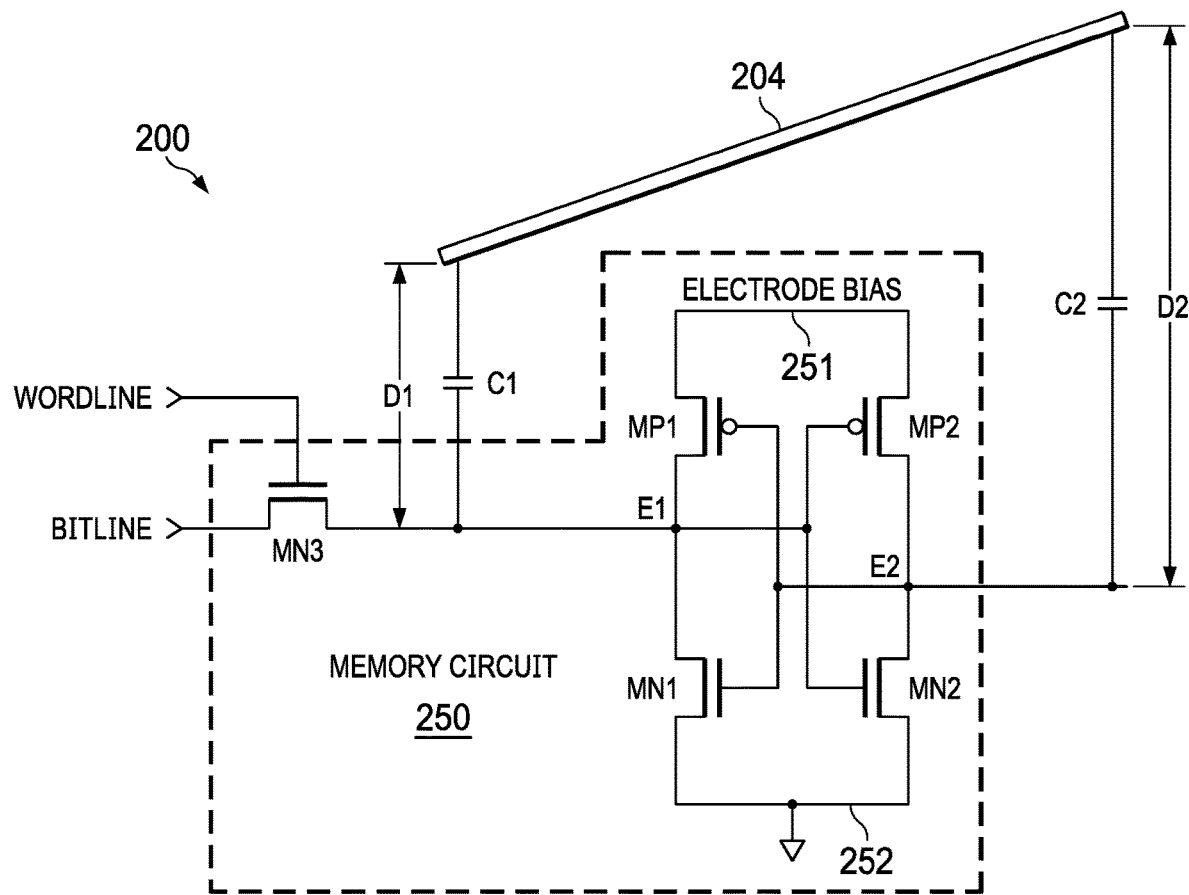
FIG. 3 illustrates the micromirror cell with its micromirror tilted at a different angle from that of FIG. 2 in accordance with an aspect of the disclosure.
FIG. 10 shows an illustrative truth table applicable to the example of FIG. 9.

FIGS. 2 and 3 illustrate the control circuitry of an individual micromirror cell 200. The micromirror can be tilted between different tilt angles as illustrated in FIGS. 2 and 3. The micromirror cell includes a memory circuit 250 which receives control signals WORDLINE and BITLINE. The memory circuit 250 includes five transistors in this example—MP1, MP2, MN1, MN2, and MN3. Each transistor includes a control input and a pair of current terminals. The transistors MP1, MP2, MN1, MN2, and MN3 are implemented as metal oxide semiconductor field effect transistors (MOSFETs) in these examples, but can be implemented as bipolar junction transistors in other examples. MP1 and MP2 are p-type MOSFETs and MN1 and MN2 are n-type MOSFETs. As MOSFETS, the control input is a gate and the current terminals include a source and a drain.

One current terminal of MN3 is coupled to BITLINE and WORDLINE is coupled to the control input of MN3. The other current terminal of MN3 is coupled to current terminals of MP1 and MN1 as shown at node that is designated as electrode E1. The control inputs of MP1 and MN1 are coupled together as shown. Similarly, current terminals of MP2 and MN2 are coupled together as well at a node designated as electrode E2. The control inputs of MP2 and MN2 are also coupled together. Electrode E1 is coupled to the control inputs of MP2 and MN2, and electrode E2 is coupled to the control inputs of MP1 and MN1. MP1 and MN1 form an inverter. MP2 and MN2 form another inverter. A current terminal of MP1 and a current terminal of MP2 are coupled together at a node 251 and an electrode bias voltage can be generated on that node. Similarly, a current terminal of MN1 and a current terminal of MN2 are coupled together as shown at a node 252 which is connected to ground. The memory circuit 250 comprises a pair of cross-coupled inverters and are shown for convenience in other figures by inverter schematic symbols, rather than transistor circuits.

The inverters are cross-coupled to provide positive feedback to hold the state of the voltages on electrodes E1 and E2. The electrostatic force created between a given electrode E1 or E2 and the micromirror (which comprises metal) causes the tip of the micromirror to be attracted to one electrode more than the other to thereby cause the micromirror to tilt. In operation, a voltage is generated on BITLINE and provided to electrode E1 upon closure of MN3 by WORDLINE. If the voltage on E1 is a logic high, the control input of MN2 will be high thereby causing MN2 to close which places a logic low on electrode E2. The logic low on electrode E2 causes MP1 to close and MP1 is coupled to the electrode bias voltage at node 251. The electrode bias voltage reinforces the logic high voltage on electrode E1 from the BITLINE. If WORDLINE is deasserted thereby turning MN3 off, transistors MP1, MP2, MN1, and MN2 continue to maintain the voltages on electrodes E1 and E2. The electrode bias voltage can be increased at this point to a sufficiently high voltage to cause the micromirror 204 to tilt to the angle as shown in FIG. 2. FIG. 3 is identical to FIG. 2, but illustrates the micromirror 204 being tilted to a different angle as result of the BITLINE signal being asserted to a logic low level when WORDLINE is asserted.

Capacitance C1 represents the capacitance between electrode E1 and the micromirror 204. Capacitance C2 represents the capacitance between electrode E2 and the micromirror 204. The magnitude of the capacitances C1 and C2 depends on the distance between the electrodes and the micromirror. Distance D1 represents the distance between electrode E1 and the micromirror 204 and distance D2 represents the distance between electrode E2 and the micromirror 204. With the micromirror titled to a first tilt angle as shown in the example of FIG. 2, D1 is larger than D2 and, accordingly, the magnitude of capacitance C1 is smaller than the magnitude of capacitance C2. Conversely, in the example of FIG. 3 with the micromirror tilted to a second tilt angle, D1 is smaller than D2 and the magnitude of capacitance C1 is greater than the magnitude of capacitance C2.

In accordance with the disclosed embodiments, by measuring the magnitude of C1 and C2 after commanding the memory circuit 250 to tilt the micromirror 204 to one tilt angle and then measuring the magnitude of C1 and C2 after commanding the memory circuit 250 to tilt the micromirror 204 to the other tilt angle, the values of C1 and C2 can be processed to determine if the micromirror 204 is stuck or missing altogether. C1 and C2 represent the capacitance created between the micromirror and the respective electrode and are not physical capacitor circuit components formed on the semiconductor die 201. Further, in the disclosed embodiments, values indicative of the magnitude of C1 and C2 are determined instead of measuring the actual capacitance values.

The disclosed technique permits the DMD to electrically determine whether any of its mirrors are stuck or missing. As such, an optical visual inspection and interrogation of the mirrors is not required. The electrical interrogation described herein can be performed at the factory or in situ (i.e., with the DMD installed in a system).

Figure 4:
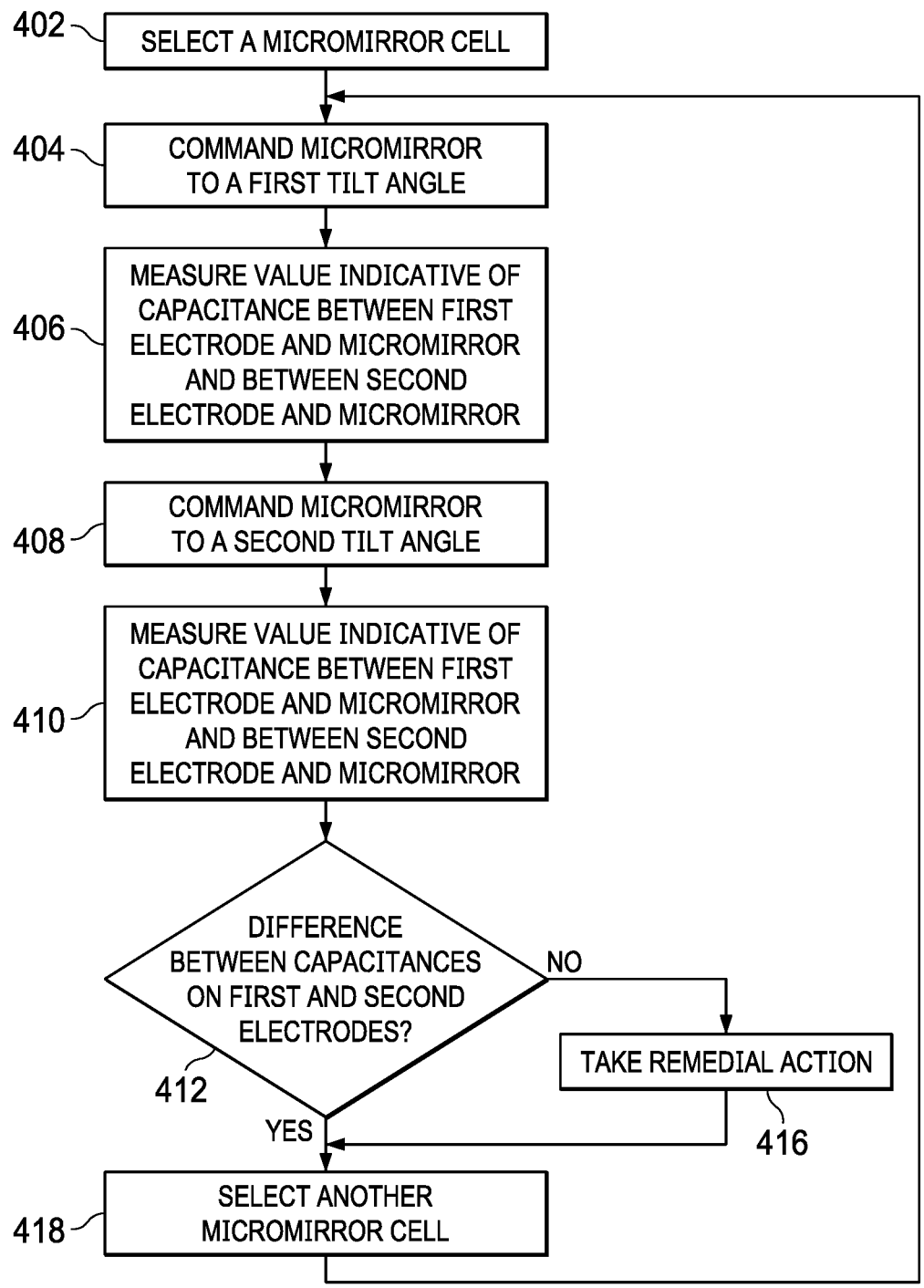
FIG. 4 shows a method for determining whether a micromirror is stuck or missing in accordance with an aspect of the disclosure.

FIG. 4 illustrates a method for determining whether any of the micromirrors on a DMD are stuck or missing. The examples discussed herein for performing a capacitive assessment on individual micromirror cells is controlled by a controller. The controller asserts, or causes to be asserted, control signals to the various switches described below to initiate the flow of current from a current source to the electrodes of each micromirror cell and to initiate a counter to begin counting pulses of clock. In some examples, the controller is the controller 180 (FIG. 1B), which is external to the DMD 190. In other examples, the controller is provided on the DMD 180. In yet other examples, the controller function is implemented in part by external controller 180 and in part by a controller on the DMD 190. For example, a controller on the DMD 190 closes the appropriate switches to couple one of the electrodes of a micromirror cell to the measurement circuit, initiates current flow to the coupled electrode, and causes the counter to begin counting pulses of a clock, while the external controller 180 receives and stores the count values from the counter and determines whether a micromirror 204 is stuck or missing.

At 402, the method includes selecting a micromirror cell. This operation can be performed by a controller coupled to the DMD. At 404, the controller than commands the micromirror of the selected micromirror cell to rotate to a first tilt angle. This operation can be performed by the controller asserting control signals to cause the BITLINE and WORDLINE signals to be asserted to the micromirror cell 200. The BITLINE voltage causes the micromirror of the selected micromirror cell 200 to rotate to the first title angle as explained above.

At 406, the method includes measuring a value indicative of the capacitance between electrode E1 and the micromirror and between electrode E2 and the micromirror. Examples of how a measurement circuit can measure these values are provided below.

At 408, the controller again commands the micromirror of the selected micromirror cell to rotate to a second tilt angle. This operation can be performed by the controller again asserting control signals to cause the BITLINE and WORDLINE signals to be asserted to the micromirror cell 200. The BITLINE voltage causes the micromirror of the selected micromirror cell 200 to rotate to the second title angle as explained above.

At 410, the method includes again measuring a value indicative of the capacitance between electrode E1 and the micromirror and between electrode E2 and the micromirror. At 412, the measurement circuit processes the four values indicative of C1 and C2 at the two commanded tilt angles to determine if a difference exists between the values at the two tilt angles. In one example, the measurement circuit determines the difference between C1 and C2 for the micromirror at the first title angle (DIFF1), again determines the difference between C1 and C2 for the micromirror at the second tilt angle (DIFF2), and then determines whether DIFF1 and DIFF2 are different. If the micromirror has successfully moved from the first tilt angle to the second tilt angle, one of DIFF1 and DIFF2 will be positive value and the other of DIFF1 and DIFF2 will be a negative value. If DIFF1 and DIFF2 are the same (both positive or both negative), then at 416 the measurement circuit takes a remedial action such as by asserting an output signal indicating that the micromirror 204 for the given micromirror cell 200 is stuck or missing. For a stuck micromirror 204, the controller that receives a video signal to then control the various micromirror cells on the DMD can avoid using that particular micromirror cell, increase bias voltage in an attempt to unstick it, or perform another remedial action. Control passes to 418 at which another micromirror cell on the DMD is selected for analysis and control loops to 404. If, however, the measurement circuit determines that the micromirror 204 is not stuck or missing ("yes" branch from decision 412), then control passes to operation 418.

Figure 5:
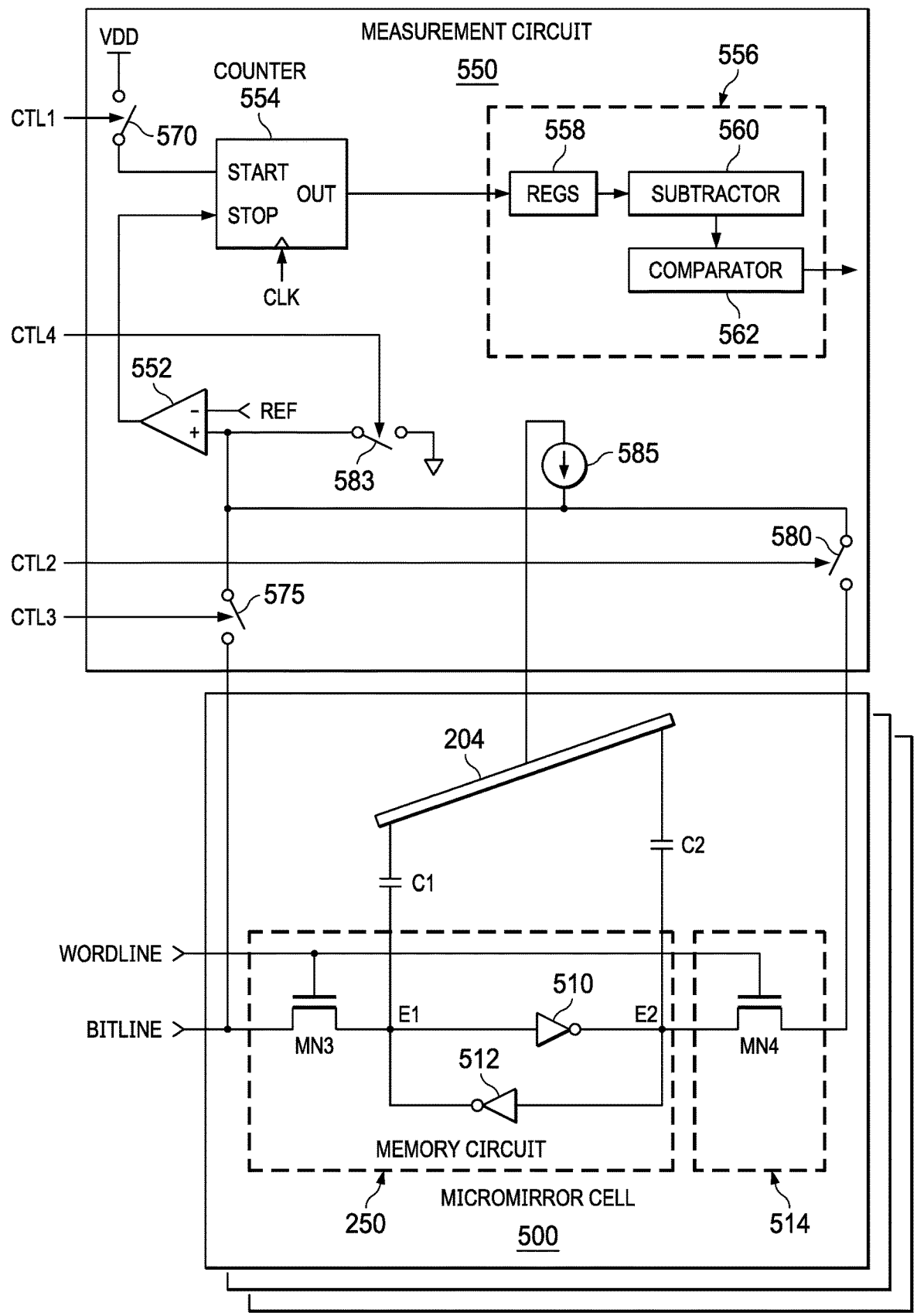
FIG. 5 shows an example of a micromirror cell coupled to a measurement circuit in accordance with an aspect of the disclosure.

FIG. 5 shows an example of a portion of a DMD including multiple micromirror cells 500 coupled to a measurement circuit 550. The micromirror cell 500 in this example includes the micromirror 204, the memory circuit 250 (with transistors MP1, MP2, MN1, and MN2 replaced in the schematic with inverter symbols as inverters 510 and 512), MN3, and an electrode selection circuit 514. The electrode selection circuit 514 in this example includes an n-type MOSFET MN4 whose control input is controlled by the same WORDLINE signal that controls the control input of MN3. In other examples, MN3 and MN4 can be implemented as p-type MOSFETs and WORDLINE being low opens MN3 and MN4. The electrode selection circuit 514 permits the measurement circuit to electrically access electrode E2 to generate a value indicative of the magnitude of C2.

The measurement circuit 550 in this example includes a voltage comparator 552, a counter 556, a logic circuit 556, switches 570, 575, 580, and 583, and a current source 585. Switches 570, 575, 580, and 583 are controlled via individual control signals CTL1, CTL2, CL3, CTL4, respectively, which are asserted by a controller as explained above. When switch 575 is closed (and 580 is open), current from current source 585 flows through switch 575, and through MN3 to electrode E1 to the capacitance C1 to charge the capacitance C1. As a fixed current is flowing through the capacitance C1, the voltage on the capacitance C1 at the electrode E1 increases linearly with respect to time as a function of the ratio of the fixed current level from current source 585 to the magnitude of capacitance C1.

To determine a value indicative of the magnitude of capacitance C1, a controller (e.g., controller 180) asserts control signals to the DMD to cause a voltage to be generated on the BITLINE to tilt the micromirror to a first tilt angle (such as that shown in FIG. 5). Once the WORDLINE signal is asserted, MN3 closes thereby providing the BITLINE voltage to electrode E1 with an inverted version of the BITLINE voltage generated on electrode E2. The micromirror 204 rotates as described above.

To make the capacitance measurement, the BITLINE is tristated (i.e., not actively driven). Switches 570 and 575 are then closed. WORDLINE also is asserted thereby turning on both MN3 and MN4. Closing switch 570 asserts a high signal on the start input of counter 554. The counter 554 counts pulses of a clock signal (CLK) following assertion of its start input. The counter 554 is implemented as a count up counter and thus its output signal is a monotonically increasing count value starting from 0 and increasing 1, 2, 3, etc. As the counter 554 begins to count up from 0, current from current source 585 flows through C1 and the voltage on electrode E1 begins to rise. Control signal CTL4 causes switch 583 to momentarily close to pull the voltage on electrode E1 low to thereby reset the comparator 552. The electrode E1 is coupled through MN3 and switch 575 to the positive input of comparator 552. The negative input of comparator 552 receives a reference voltage (REF). Initially, the output of comparator 552 is a logic low voltage. Once the voltage on electrode E1 exceeds the reference voltage REF, the output of the comparator 554 becomes a logic high. The output of comparator 554 is provided to a stop input of the counter 554. Assertion of the stop input causes the counter 554 to stop counting and its output count value is held. The output value from the counter 554 represents the number of pulses of CLK that occurred between the time current from the current source 585 was initially provided to C1 (with the voltage on electrode E1 being low) and the time that the voltage on electrode E1 reached the reference voltage REF. The count value from counter 554 is a digital value indicative of the magnitude of C1.

Switches 575 and 570 are then opened. The counter 554 is reset through a separate reset input to the counter 554, by cessation of asserting the start input high, or by other counter reset options. Further switch 583 is again closed via CTL4 to pull the voltage on electrode E2 to again reset the comparator 552. Switches 570 and 580 are then closed and the process described above repeats but with the current from current source 585 flowing through capacitance C2 and electrode E2 being electrically coupled to the positive input of the comparator 552.

The comparator output count values indicative of C1 and C2 are stored in registers 558 of the logic circuit 556. The logic circuit 556 also includes a subtractor 560 and a comparator 562. The process described above to generate the count values indicative of C1 and C2 with the micromirror 204 tilted to one tilt angle is repeated after commanding the micromirror cell 500 to rotate its micromirror 204 to the opposing tilt angle. The registers 558 at this point contain four count values indicative of C1 and C2 with the micromirror cell 500 commanded to one tilt angle as well as the count value indicative of C1 and C2 with the micromirror cell 500 commanded to the other tilt angle. The subtractor then computes the count value differences as explained above. For example, the subtractor determines the difference between the count value indicative of C1 and the count value indicative of C2 at one tilt angle (DIFF1) and also determines the difference between the count value indicative of C1 and the count value indicative of C2 at the other tilt angle (DIFF2). The comparator 562 then compares DIFF1 to DIFF2 to determine whether they are the same or different. If the micromirror 204 successfully rotated between tilt angles, then one of DIFF1 and DIFF2 should be a positive value and the other should be a negative value. If the micromirror 204 for a given micromirror cell 500 is stuck (not rotating between tilt angles when the micromirror cell is commanded), the comparator 562 outputs a signal indicating that DIFF1 and DIFF2 are the same thereby indicating that the micromirror being stuck at a particular angle. Otherwise, if the micromirror 204 is not stuck, the comparator 562 generates its output signal to so indicate. If the micromirror 204 is missing (e.g., manufacturing defect), the count values from counter 554 will not change upon the micromirror cell 500 commanded to a different tilt angle and thus the output of logic 556 indicates whether the micromirror 204 is stuck or missing. If the mirror is missing, the count values indicative of capacitance will be small (nominally zero, but may have a small non-zero value due to stray capacitance). The logic circuit 556 can determine that the mirror is missing by determining whether each count value is below a small threshold.

Figure 6:
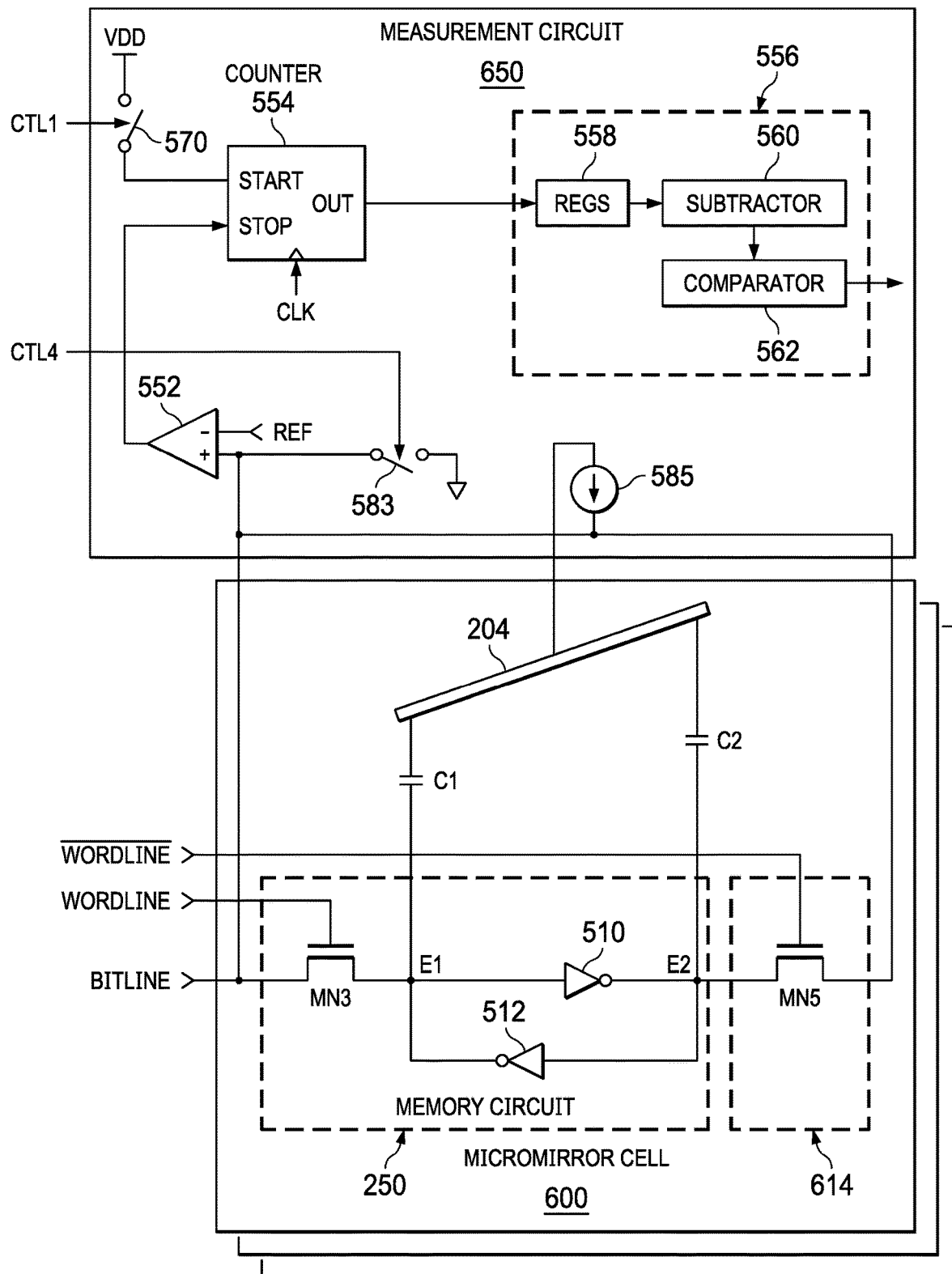
FIG. 6 shows another example of a micromirror cell coupled to a measurement circuit in accordance with an aspect of the disclosure.

In the example of FIG. 5, each electrode selection circuit 514 includes a MOSFET (MN4) that is turned on and off concurrently with MN3 as both transistors MN3 and MN4 are controlled by the same WORDLINE signal. The use of switches 575 and 580 in the measurement circuit 550 permits one electrode or the other (E1 and E2) to be electrically coupled to the measurement circuit for determination of a value indicative of C1 and C2. FIG. 6 shows an example similar to that of FIG. 5. In FIG. 6, a measurement circuit 650 is coupled to multiple micromirror cells 600. Each micromirror cell 600 is similar to each micromirror cell 500 of FIG. 5. An electrode selection circuit 614 in FIG. 6 includes an n-type MOSFET MN5. Rather than MN5 being controlled by WORDLINE, as was the case for MN4 in FIG. 5, MN5 is controlled by an inverted version of WORDLINE ($\overline{\text{WORDLINE}}$), asserted by a controller as explained above. Because MN3 and MN5 are turned on reciprocally (i.e., when MN3 is on, MN5 is off, and vice versa), the measurement circuit 650 need not include the switches 575 and 580 of FIG. 5. The measurement circuit 650 is otherwise the same in architecture and operation as measurement circuit 550 described above, and thus its operation is not repeated here.

Figure 7:
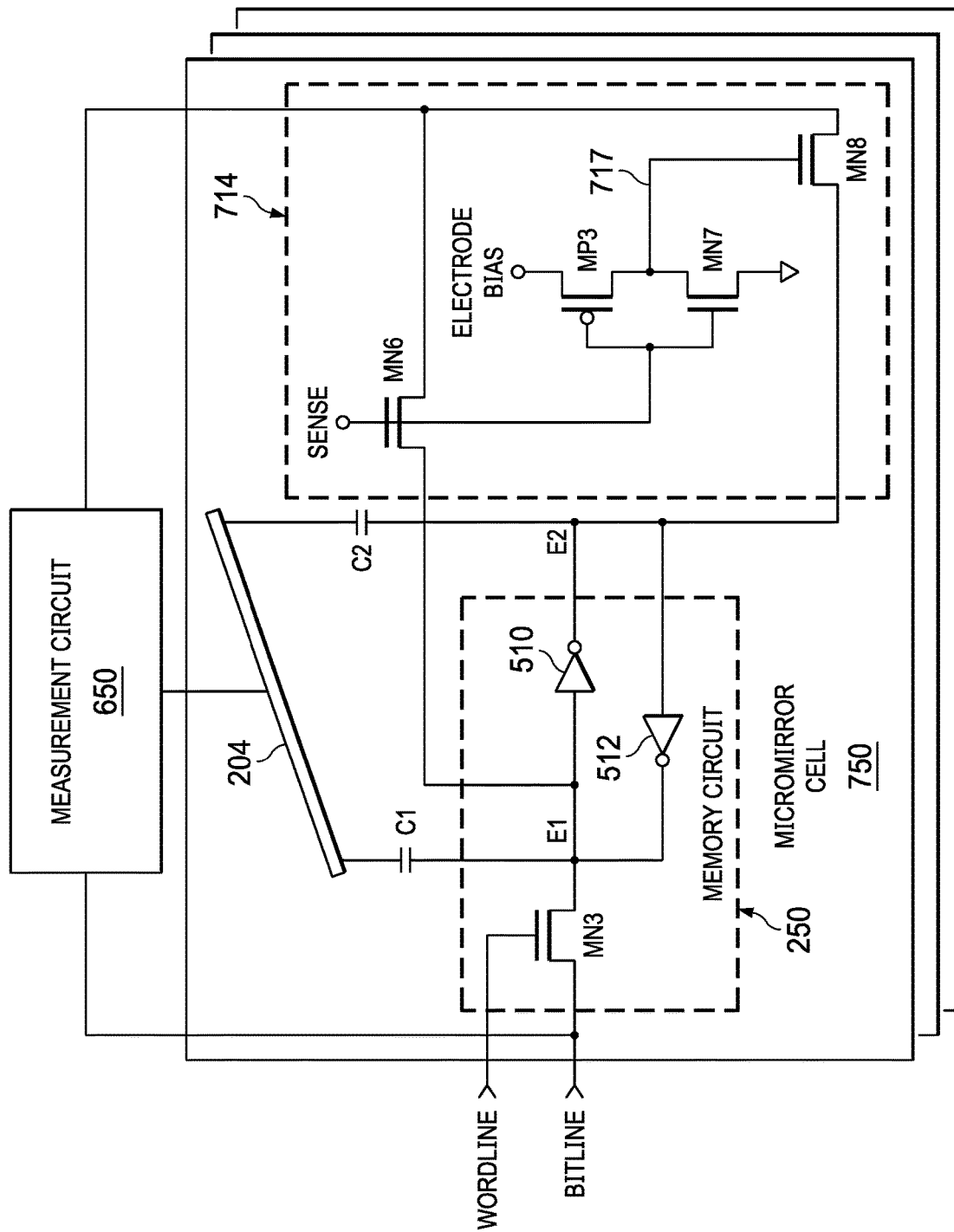
FIG. 7 shows yet another example of a micromirror cell coupled to a measurement circuit in accordance with an aspect of the disclosure.

FIG. 7 shows an example of multiple micromirror cells 750 coupled to the measurement circuit 650 of FIG. 6. The micromirror cell 750 in this example is similar to the example micromirror cells described above except for the electrode selection circuit 750. In the example of FIG. 66, the electrode selection circuit 714 includes n-type MOSFETS MN6, MN7, and MN8 and a p-type transistor MP3. MP3 and MN7 are coupled together as an inverter. The control inputs of MP3 and MN7 are connected together and to a control signal (SENSE) generated by a controller as noted above. A current terminal of MP3 is connected to a current terminal of MN7 to provide an output signal 717 from the inverter formed by MP3 and MN7. The output signal 717 from the inverter (MP3/MN7), which is logically inverted from control signal SENSE, is coupled to a control input of MN8. The control input of MN6 is coupled to SENSE. Thus, when SENSE is asserted high, MN6 turns on and MN8 turns off. Conversely, when SENSE is low, MN6 turns off and MN8 turns on.

One current terminal of MN6 is coupled to electrode E1 and the other current terminal of MN6 is coupled to the measurement circuit 650. One current terminal of MN8 is coupled to electrode E2 and the other current terminal of MN8 is coupled to the measurement circuit 650. When SENSE is high, electrode E1 is coupled through MN6 to the measurement circuit 650 (and to comparator 552), and electrode E2 is decoupled from the measurement circuit 650 due to MN8 being off. Conversely, when SENSE is low, electrode E2 is coupled through MN8 to the measurement circuit 650 (and to comparator 552), and electrode E1 is decoupled from the measurement circuit 650 due to MN6 being off. In this example, a single control signal, SENSE, is used to control MN6 and MN8 and thus the electrical coupling of electrodes E1 and E2 to the measurement circuit 650.

Figure 8:
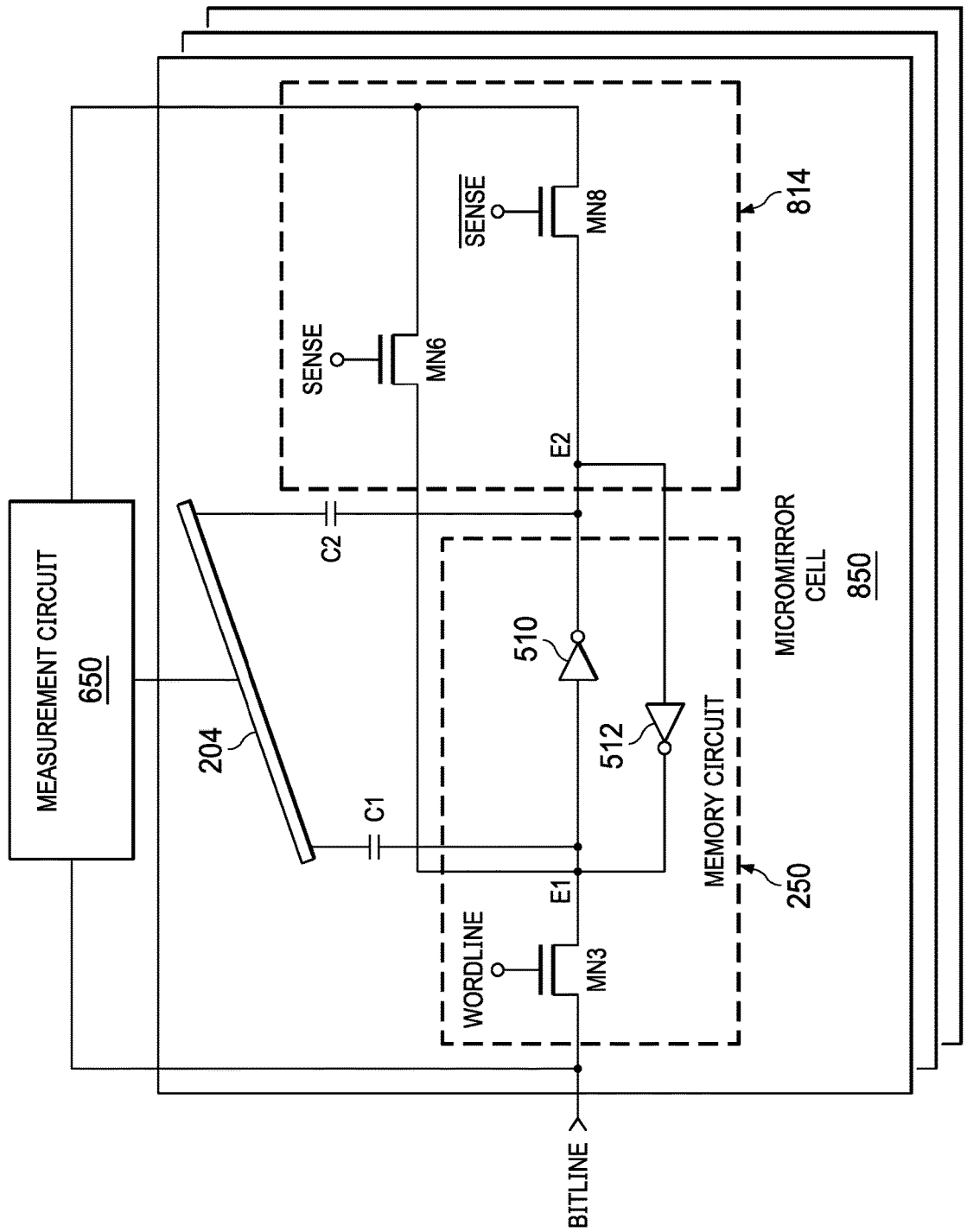
FIG. 8 shows another example of a micromirror cell coupled to a measurement circuit in accordance with an aspect of the disclosure.

FIG. 8 includes an example of a micromirror cell 850 similar to that of the micromirror cell 750 of FIG. 7. The difference between micromirror cell 850 and micromirror cell 750 is that MN8 in the electrode selection circuit 814 of FIG. 8 is controlled by an inverted version of SENSE ($\overline{\text{SENSE}}$) generated external to the micromirror cell 850, rather than the micromirror cell including an inverter to generate the control signal for the control input of MN8 as in FIG. 7. Both SENSE and $\overline{\text{SENSE}}$ can be set to a logic low value to decouple the measurement circuit 650 from the memory circuit 250 when, for example, the memory circuit is being controlled to rotate the micromirror 204.

Figure 9:
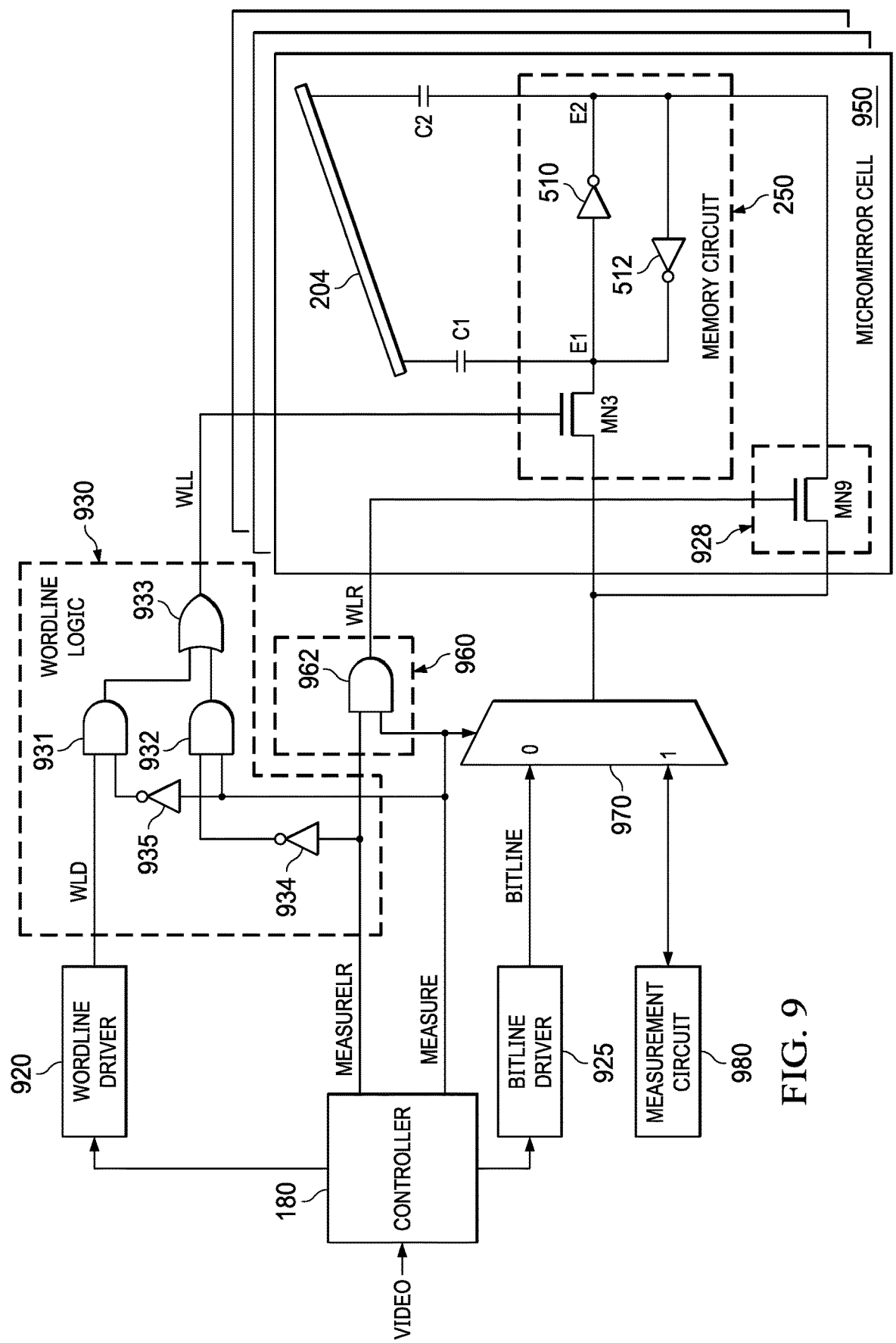
FIG. 9 shows another example of a micromirror cell coupled to a measurement circuit and a controller in accordance with an aspect of the disclosure.

FIG. 9 shows another example including the controller 180, multiple micromirror cells 950, a WORDLINE driver 920, a BITLINE driver 925, a WORDLINE logic circuit 930, a logic circuit 960, a measurement circuit 980, and a multiplexer 970. The micromirror cell 950 of FIG. 9 includes a memory circuit 250 as described above coupled to a micromirror 204. An electrode selection circuit 928 includes n-type MOSFET MN9.

The logic circuit 960 in this example includes an AND gate 962. The WORDLINE logic circuit 930 includes AND gates 931 and 932, OR gate 933 and inverters 934 and 935. The controller 180, which may be external to the DMD comprising the micromirror cells 950, asserts a control signal to the WORDLINE driver 920, a control signal to BITLINE driver 925, a MEASURE control signal and a MEASURELR control signal. The MEASURE control signal indicates whether a measurement of C1 and C2 is to be made (e.g., MEASURE being a logic low) or whether the controller 180 is to actively control the tilt angle of the micromirror 204 of each micromirror cell 950 (e.g., MEASURE being a logic high).

During a capacitive value measurement operation, MEASURELR indicates whether C1 for electrode E1 is to be determined or whether C2 for electrode E2 is to be determined. MEASURELR being a logic high indicates that electrode E2 is to be coupled to the measurement circuit via MN9, while MEASURELR being a logic low indicates that electrode E1 is to be coupled to the measurement circuit via MN3.

Multiplexer 970 is controlled by MEASURE to couple the BITLINE driver 925 to MN3 (e.g., to control the tilt state of the micromirror 204 as described above) or to couple the measurement circuit 980 to the micromirror cell to determine values indicative of C1 and C2. The measurement circuit 980 in this example may be the same or similar to that described above for any one or more of the other measurement circuits.

For the WORDLINE logic circuit 930, inverter 934 inverts MEASURELR and inverter 935 inverts MEASURE. AND gate 931 is coupled to the WORDLINE driver 920 and to the output of inverter 935, and AND gate 932 couples to inverter 934 and to the MEASURE control signal. The outputs of AND gates 931 and 932 are coupled to OR gate 933, which logically ORs together the outputs of the AND gates 931, 932. The output of OR gate 933 is labeled as WLL and is a control signal for the control input of MN3. The AND gate 962 of logic circuit 960 is labeled as WLR and is a control signal for the control input of MN9.

FIG. 10 provides a truth table pertaining to WORDLINE logic circuit 930 and logic circuit 960. To first four rows in the truth table show MEASURE as a "0" (logic low) which, via AND gate 962, causes WLR to be 0 thereby causing MN9 to be off. Further, with MEASURE being low, the "0" input of multiplexer (coupled to BITLINE driver 925) is provided to its output and thus the signal from the BITLINE driver 925 is provided to MN3 and used to control the micromirror's tilt angle upon WLL being asserted high. WLL will be high ("1") when, as shown in the third and fourth rows of the truth table, WLD is a 1.

To couple the measurement circuit 950 to the micromirror cell 950, MEASURE is asserted to a 1 (logic high) which causes the "1" input of multiplexer to be provided as its output. With MEASURE being a 1, the output of inverter 935 is a 0 and thus the output of AND gate 931 is a 0. The output of AND gate 932, however, is a 0 when MEASURELR is a 1 and the output of AND gate 932 is a 1 when MEASURELR is a 0. Thus, the output of the OR gate 933 (WLL) is a logic high when MEASURELR is a 0 (as shown in rows 5 and 7 of the truth table). Conversely, WLL is a logic low when MEASURELR is a 1 (as shown in rows 6 and 8 of the truth table).

The output of AND gate 962, with MEASURE being a 1, is the same logic state as MEASURELR. Thus, WLR will be a 1 when MEASURELR is a 1 and WLR is a 0 when MEASURELR is a 0. Thus, by controlling MEASURELR and MEASURE, the controller 180 can cause either electrode E1 or E2 to be coupled to the measurement circuit 950 for determination of values indicative of the respective C1 and C2.

Modifications are possible in the described embodiments, and other embodiments are possible, within the scope of the claims.

What is claimed is:

1. A system comprising:
    a micromirror cell comprising:
        a micromirror;
        a memory circuit capacitively coupled to the micromirror, the memory circuit comprising:
            a first inverter having a first inverter input and a first inverter output;
            a second inverter having a second inverter input and a second inverter output, the second inverter input coupled to the first inverter output and a the second inverter output coupled to the first inverter input; and
            a first transistor having a first current terminal, a second current terminal, and a first control terminal, the first current terminal coupled to the first inverter input; and
        a second transistor having a third current terminal, a fourth current terminal, and a second control terminal, the third current terminal coupled to the first inverter output and
    a measurement circuit coupled to the second current terminal and the fourth current terminal, the measurement circuit comprising:
        a current source coupled to the second current terminal and the fourth current terminal;
        a comparator having a first comparator input, a second comparator input, and a comparator output, the first comparator input coupled to the second current terminal and the fourth current terminal; and
        a counter coupled to the comparator output.

2. The system of claim 1, wherein the first control terminal is coupled to the second control terminal.

3. The system of claim 1, wherein the memory circuit further comprises:
    a third transistor having a fifth current terminal, a sixth current terminal, and a third control terminal, the fifth current terminal coupled to the first current terminal and the sixth current terminal coupled to the fourth current terminal;
    a fourth transistor having a seventh current terminal, an eighth current terminal, and a fourth control terminal, the fourth control terminal coupled to the third control terminal and the eighth current terminal coupled to the second control terminal; and
    a fifth transistor having a ninth current terminal, a tenth current terminal, and a fifth control terminal, the ninth current terminal coupled to the eighth current terminal and the fifth control terminal coupled to the fourth control terminal.

4. The system of claim 1, wherein the memory circuit further comprises a third transistor having a fifth current terminal, a sixth current terminal, and a third control terminal, wherein the fifth current terminal is coupled to the first current terminal and the sixth current terminal is coupled to the fourth current terminal.

5. The system of claim 1, further comprising a controller coupled to the memory circuit and to the measurement circuit.

6. The system of claim 1, wherein the measurement circuit and the memory circuit are on a die.

7. The system of claim 1, wherein the first control terminal is configured to receive a wordline signal and the second current terminal is configured to receive a bitline signal.

8. The system of claim 7, wherein the second control terminal is configured to receive the wordline signal or an inverse of the wordline signal.

9. A system comprising:
    a micromirror cell comprising:
        a micromirror;
        a memory circuit capacitively coupled to the micromirror, the memory circuit comprising:
            a first inverter having a first inverter input and a first inverter output;
            a second inverter having a second inverter input and a second inverter output, the second inverter input coupled to the first inverter output and a the second inverter output coupled to the first inverter input; and
            a first transistor having a first current terminal, a second current terminal, and a first control terminal, the first current terminal coupled to the first inverter input; and
        a second transistor having a third current terminal, a fourth current terminal, and a second control terminal, the third current terminal coupled to the first inverter output;
    a multiplexer having a first multiplexer input, a second multiplexer input, and a multiplexer output, the multiplexer output coupled to the second current terminal and to the fourth current terminal;
    a bitline driver coupled to the first multiplexer input and a measurement circuit coupled to the second multiplexer input.

10. The system of claim 9, further comprising:
    a controller coupled to the bitline driver and to the multiplexer;
    a wordline driver coupled to the controller;
    wordline logic coupled to the wordline driver, to the controller, and to the first control terminal; and
    a logic circuit coupled to the wordline logic, to the controller, and to the second control terminal.

11. The system of claim 9, further comprising a controller coupled to the bitline driver and to the multiplexer.

12. The system of claim 10, wherein the measurement circuit and the memory circuit are on a die.

13. The system of claim 9, wherein the first control terminal is configured to receive a wordline signal and the second current terminal is configured to receive a bitline signal.

14. The system of claim 1, further comprising a logic circuit coupled to the counter.

15. A system comprising:
    a micromirror cell comprising:
        a micromirror;
        a memory circuit capacitively coupled to the micromirror, the memory circuit comprising:
            a first inverter having a first inverter input and a first inverter output;
            a second inverter having a second inverter input and a second inverter output, the second inverter input coupled to the first inverter output and a the second inverter output coupled to the first inverter input; and a first transistor having a first current terminal, a second current terminal, and a first control terminal, the first current terminal coupled to the first inverter input; and a second transistor having a third current terminal, a fourth current terminal, and a second control terminal, the third current terminal coupled to the first inverter output; and a measurement circuit coupled to the second current terminal and to the fourth current terminal, the measurement circuit comprising:

a current source coupled to the second current terminal and to the fourth current terminal;

a comparator having a first comparator input, a second comparator input, and a comparator output, the first comparator input coupled to the second current terminal and to the fourth current terminal;

a counter having a first counter input, a second counter input, and a counter output, the first counter input coupled to the comparator output; and a logic circuit having a logic input and a logic output, the logic input coupled to the counter output; and a controller coupled to the first control terminal, to the second control terminal, to the second current terminal, and to the logic output.

16. The system of claim 15, further comprising:
a first switch coupled between the first comparator input and a ground terminal; and
a second switch coupled between the second counter input and a supply voltage terminal.

17. The system of claim 16, further comprising:
a third switch coupled between the first comparator input and the second current terminal; and a fourth switch coupled between the first comparator input and the fourth current terminal.

18. The system of claim 15, wherein the comparator is a first comparator, and wherein the logic circuit comprises:
registers coupled to the counter output;
a subtractor coupled to the registers; and
a second comparator coupled to the subtractor.

19. The system of claim 10, wherein the logic circuit comprises an AND gate having a first AND input, a second AND input, and an AND output, the first AND input coupled to the controller, the second AND input coupled to the controller, and the AND output coupled to the second control terminal.

20. The system of claim 10, wherein the wordline logic comprises:

a third inverter having a third inverter input and a third inverter output, the third inverter input coupled to the controller;

a fourth inverter having a fourth inverter input and a fourth inverter output, the fourth inverter input coupled to the controller;

a first AND gate having a first AND input, a second AND input, and a first AND output, the first AND input coupled to the third inverter output and the second AND input coupled to the fourth inverter input;

a second AND gate having a third AND input, a fourth AND input, and a second AND output, the third AND input coupled to the wordline driver and the fourth AND input coupled to the fourth inverter output; and an OR gate having a first OR input, a second OR input, and an OR output, the first OR input coupled to the first AND output, the second OR input coupled to the second AND output, and the OR output coupled to the first control terminal.

* * * * *